(12) United States Patent
Mahler et al.

(10) Patent No.: US 7,662,726 B2
(45) Date of Patent: Feb. 16, 2010

(54) INTEGRATED CIRCUIT DEVICE HAVING A GAS-PHASE DEPOSITED INSULATION LAYER

(75) Inventors: Joachim Mahler, Regensburg (DE); Henrik Ewe, Burglengenfeld (DE); Manfred Mengel, Bad Abbach (DE)

(73) Assignee: Infineon Technologies AG, Neubiberg (DE)

( * ) Notice: Subject to any disclaimer, the term of this patent is extended or adjusted under 35 U.S.C. 154(b) by 81 days.

(21) Appl. No.: 11/854,877

(22) Filed: Sep. 13, 2007

(65) Prior Publication Data

US 2009/0072415 A1 Mar. 19, 2009

(51) Int. Cl.
*H01L 21/31* (2006.01)
*H01L 21/16* (2006.01)

(52) U.S. Cl. .................. 438/758; 438/106
(58) Field of Classification Search .......... 438/758, 438/106, 26, 55, 128, 584, 599, 107; 257/686, 257/E23.031, E23.18
See application file for complete search history.

(56) References Cited

U.S. PATENT DOCUMENTS

| 5,110,712 | A | 5/1992 | Kessler et al. | |
| 6,497,923 | B2 * | 12/2002 | Baalmann et al. | 427/488 |
| 6,748,959 | B1 * | 6/2004 | Kashiwaya et al. | 134/1.1 |
| 6,882,045 | B2 * | 4/2005 | Massingill et al. | 257/724 |
| 2004/0197474 | A1 | 10/2004 | Vrtis et al. | |
| 2005/0029644 | A1 * | 2/2005 | Ho et al. | 257/686 |
| 2005/0225238 | A1 * | 10/2005 | Yamazaki | 313/506 |
| 2006/0138649 | A1 * | 6/2006 | Karnezos | 257/723 |
| 2007/0042525 | A1 * | 2/2007 | Dimmler | 438/99 |

FOREIGN PATENT DOCUMENTS

| DE | 69204400 | | 4/1996 |
| EP | 0528540 | * | 7/1992 |

OTHER PUBLICATIONS

Quirk, Semiconductor Manufacturing Technology, 2001, Pearson Hall, pp. 260-279.*
McGraw-Hill Dictionary of Scientific and Technical Terms, 1994, p. 339.*

* cited by examiner

*Primary Examiner*—Thomas L Dickey
*Assistant Examiner*—Nikolay Yushin
(74) *Attorney, Agent, or Firm*—Dicke, Billig & Czaja, PLLC

(57) ABSTRACT

An integrated circuit device includes a semiconductor device having an integrated circuit. A gas-phase deposited insulation layer is disposed on the semiconductor device, and a conducting line is disposed over the gas-phase deposited insulation layer.

12 Claims, 3 Drawing Sheets

INTEGRATED CIRCUIT DEVICE HAVING A GAS-PHASE DEPOSITED INSULATION LAYER

BACKGROUND

Semiconductor devices, such as integrated circuit (IC) packages, typically include one or more semiconductor devices arranged on a lead frame or carrier. The semiconductor device is attached to the lead frame, typically by an adhesive die attach material or by soldering, and bond wires are attached to bond pads on the semiconductor devices and to lead fingers on the carrier to provide electrical interconnections between the various semiconductor devices and/or between a semiconductor device and the carrier. The device is then encapsulated in a plastic housing, for instance, to provide protection and form a housing from which the leads extend.

With such semiconductor packages, especially power semiconductor components, it is desirable to provide high current load-carrying capacity. To this end, some solutions for providing the desired connection density or current capacity require an insulation layer to avoid electrical contact between the conductive connections and the semiconductor device/carrier.

For these and other reasons, there is a need for the present invention.

SUMMARY

In accordance with aspects of the present disclosure, an integrated circuit device includes a semiconductor device having an integrated circuit. A gas-phase deposited insulation layer is disposed on the semiconductor device, and a conducting line is disposed over the gas-phase deposited insulation layer.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
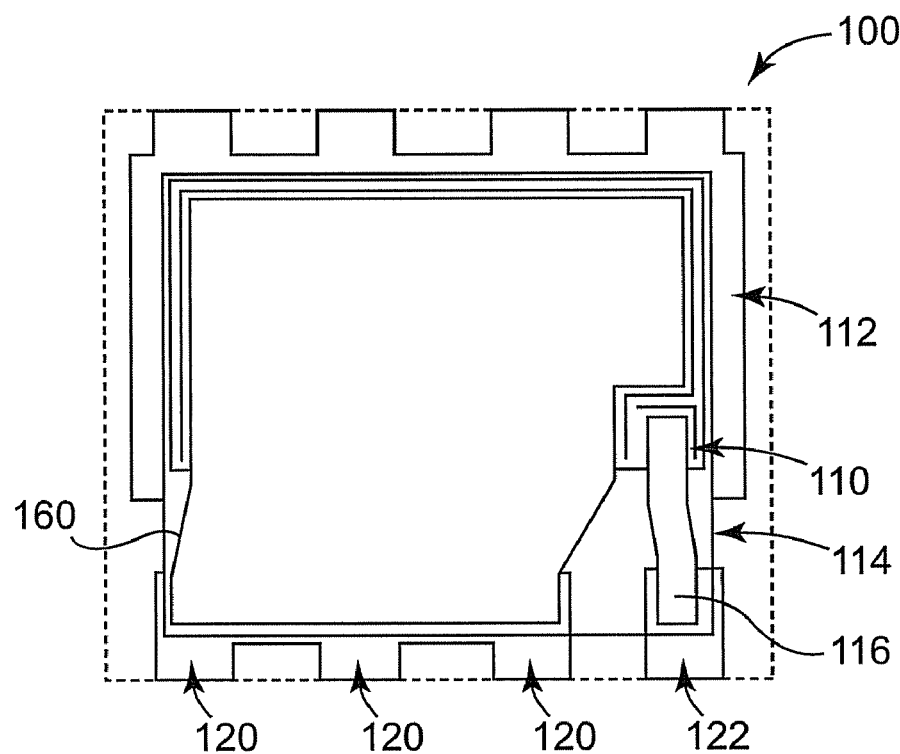
FIG. 1 is a block diagram conceptually illustrating a top view of an integrated circuit device in accordance with embodiments of the present invention.

FIG. 1 is a schematic top view conceptually illustrating an integrated circuit device in accordance with exemplary embodiments of the present invention. The exemplary integrated circuit device 100 includes a semiconductor device, or chip, 110 attached to a lead frame or carrier 112. An insulation layer 114 is deposited over the chip 110, and a conductive layer including conductive lines 116 is deposited over the insulation layer 114 to provide electrical interconnections between the chip 110 and the carrier 112. For example, in certain embodiments, the conductive layer 116 includes generally flat copper strips interconnecting the chip 110 with source and gate terminals 120, 122.

As illustrated in FIG. 1, the planar conductive connections 116 to the source terminals 120 are relatively wide (100 μm or more in exemplary embodiments) to provide the desired current and heat conductivity. The connection to the gate terminal 122 in the illustrated embodiment is thinner, allowing smaller lateral structures.

In accordance with aspects of the invention, the insulation layer 114 is gas-phase deposited. Among other things, using a gas-phase deposition rather than foil technology provides improved adhesion of the insulation layer 114 on the chip 110 and carrier 112. Further, applying the insulation layer from the gas phase can provide better surface wetting, a higher surface reactivity and good conformance to the surface topography under the insulation layer 114. Still further, the gas-phase deposited insulation layer 114 has a high thermal stability and imparts a relatively small thermal-mechanical stress on the device since the process can take place at ambient temperature in certain implementations.

Figure 2:
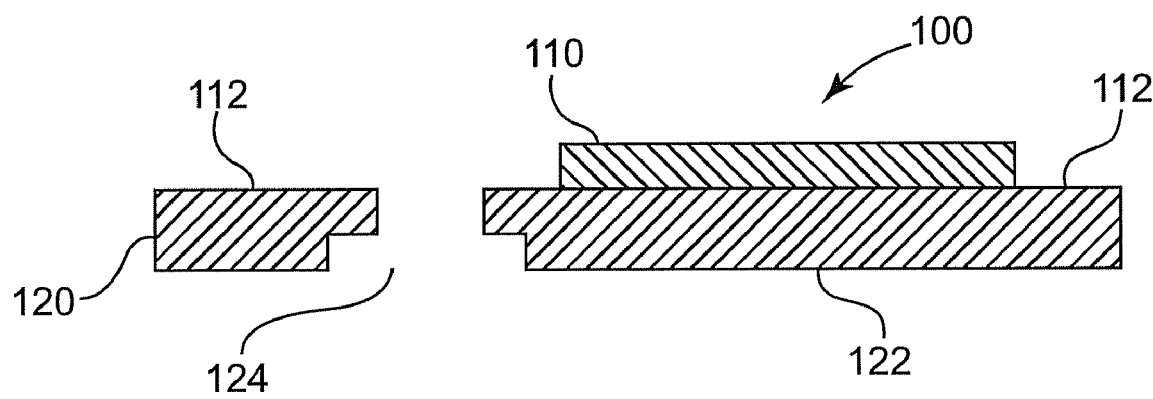
FIGS. 2-6 are side views conceptually illustrating various aspects of an integrated circuit device in accordance with embodiments of the present invention.
Figure 3:
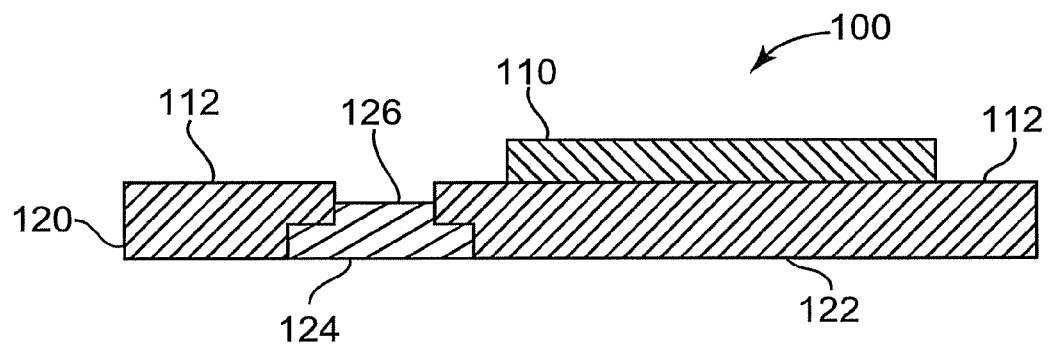

FIGS. 2-6 conceptually illustrate side views of portions of the integrated circuit device 100 in a block diagram form. In FIG. 2, the semiconductor device 110 is attached to the lead frame 112, which includes a source potion 120 and drain portion 122 separated by a gap 124. In exemplary embodiments, the semiconductor device 110 is attached in a conventional manner, such as with an adhesive die attach material or tape, soldering, etc. In FIG. 3, the gap 124 between the source 120 and drain 122 is filled with an insulating material 126 to prevent shorts between the source 120 and drain 122. The insulating material 126 permanently or temporarily fills the gap 124 to facilitate the process of applying an insulation layer.

Figure 4:
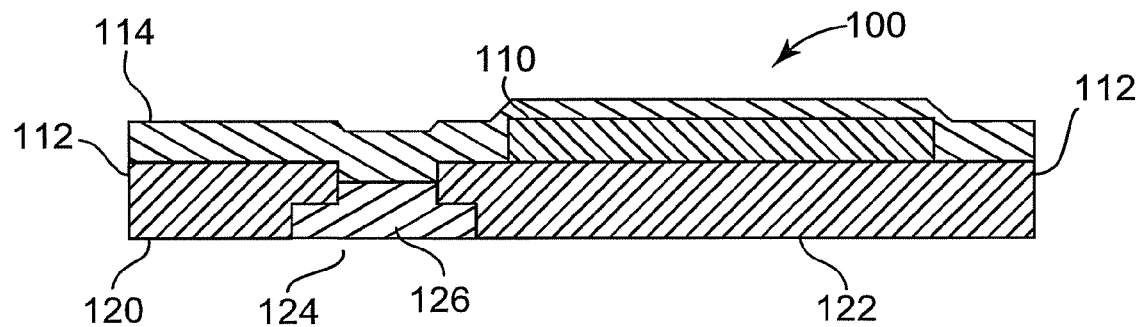

FIG. 4 illustrates the insulation layer 114 deposited over the chip 110 and lead frame 112. Typically, materials such as epoxy, polyamide or silicone would be used for the insulation layer 114, and would be applied in the liquid phase, for example, by a spin coating process. In the illustrated embodiment the insulation layer 114 is deposited in the gas phase, for example, by a chemical vapor deposition (CVD). In exemplary embodiments, the insulation layer 114 thickness varies from about 1-100 μm, 20-50 μm thick in certain embodiments.

In one embodiment, the insulation layer 114 is a plasmapolymer, and in particular, the plasmapolymer is a Parylene, such as Parylene C, Parylene N, or Parylene D. Parylenes are particularly well suited as insulation materials. They have a high electrical insulation strength. In addition, Parylene takes up only very little moisture and is comparatively elastic, so that it can buffer thermomechanical stresses between the semiconductor device 110 and adjacent layers. In addition, Parylenes often have low coefficients of thermal expansion of less than 50 ppm/K, a high thermal stability and a high chemical resistance.

Particularly, Parylene C provides a useful combination of chemical and physical properties plus a very low permeability to moisture, chemicals and other corrosive gases. Parylene C has a melting point of 290° C. Parylene N provides high dielectric strength and a dielectric constant that does not vary with changes in frequency. Parylene N has a melting point of 420° C. Parylene D maintains its physical strength and electrical properties at higher temperatures. Parylene D has a melting point of 380° C.

In another embodiment, the insulation layer 114 includes an amorphous inorganic or ceramic carbon type layer. The amorphous inorganic or ceramic carbon type layer has an extremely high dielectrical breakthrough strength and a coefficient of thermal expansion (CTE) of about 2-3 ppm/K, which is very close to the CTE of silicon of about 2.5 ppm/K. In addition, the amorphous inorganic or ceramic carbon type layer has a temperature stability up to 450-500° C.

Figure 5:
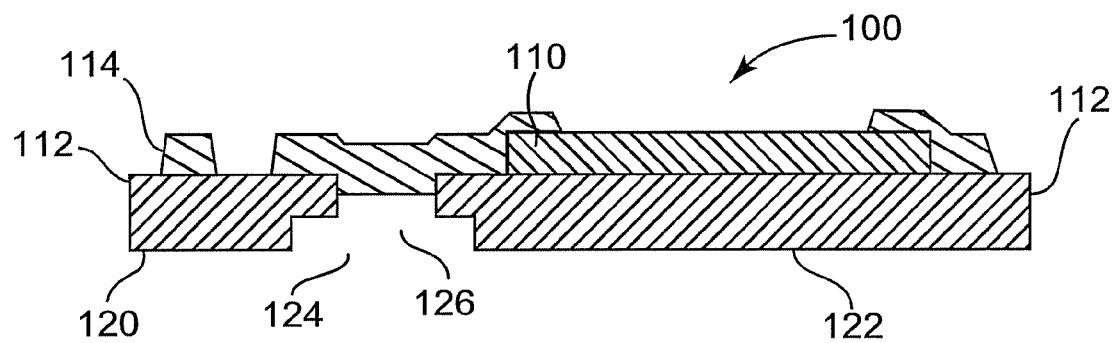
Figure 6:
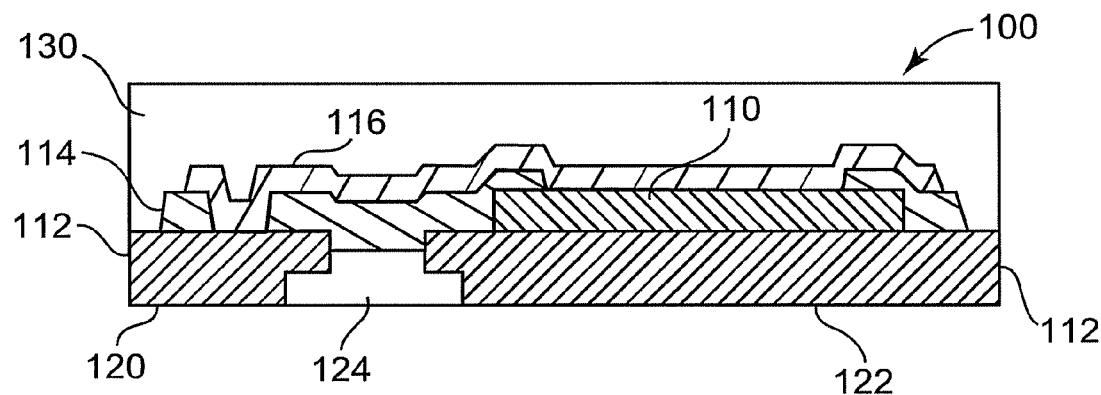

FIG. 5 illustrates the device 100 with the insulation layer 114 formed, such as by photolithographic processes, etching, laser ablation, etc. In FIG. 6, the device 100 is illustrated including the conductive layer 116 deposited on the insulation layer 114, providing interconnections between the chip 110 and the periphery of lead frame 112. The device can then be encapsulated, by any suitable molding process, for example, resulting in the encapsulation or housing 130.

Figure 7:
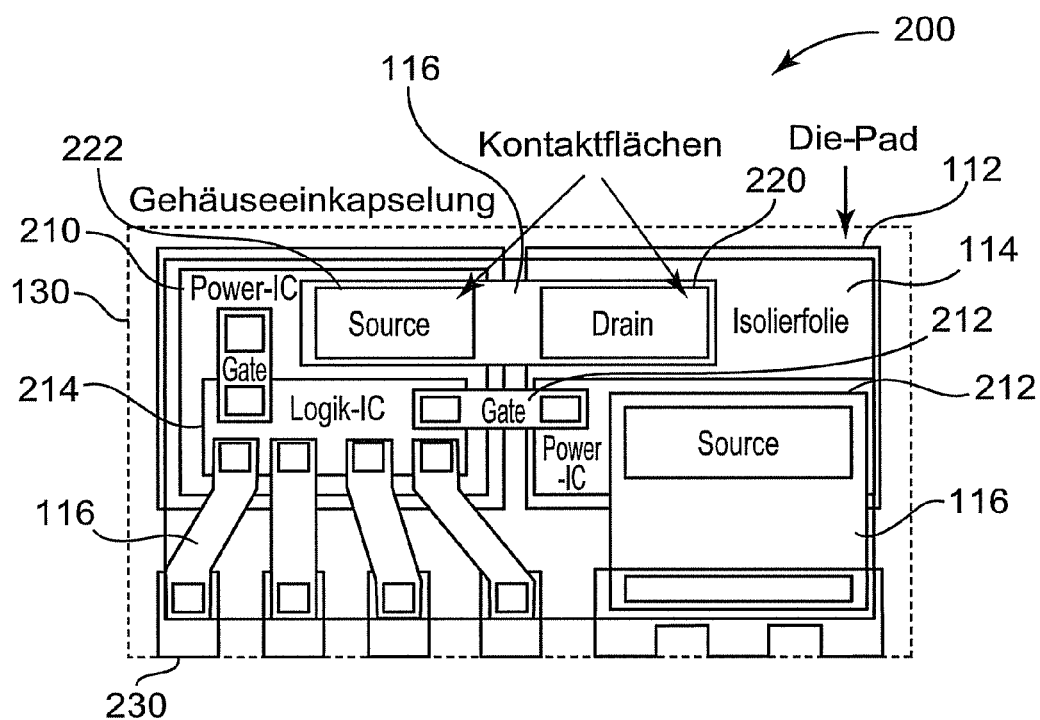
FIG. 7 is a block diagram conceptually illustrating a top view of a multi-chip module in accordance with embodiments of the present invention.

The process disclosed above is also suitable also for the contacting of a plurality of semiconductor devices in a multi-chip module. In such a multi-chip module, the interconnections between the semiconductor components can be produced in the same way and at the same time as the connections from the semiconductor devices to the periphery of the carrier. FIG. 7 illustrates an exemplary multi-chip module 200 in accordance with embodiments of the invention. The multi-chip module 200 includes semiconductor devices situated on a carrier 112. A gas-phase deposited insulation layer 114 is deposited over the semiconductor devices and the carrier 112, and the multi-chip module 200 is surrounded by an encapsulation 130.

The semiconductor devices include first and second power transistors 210,212 mounted on the carrier 112. A logic device 214 is mounted on the power transistor 210. Alternatively, the logic device 214 can be arranged along side the power transistors 210,212 if space allows. The power transistors 210,212 are arranged in a half bridge configuration, with the drain connection 220 of the high side device 212 connected to the source 222 of the low side device 210 by conductive lines 116 deposited on the insulation layer 114. The logic device 214 is connected for controlling the power transistors 210,212 via their gate contacts 224. Conductive connections 116 are further situated between various terminals of the semiconductor devices and contacts 230 situated at the periphery of the package 200, with the insulation layer 114 situated between the chips/carrier and the deposited conductive connections 116. The configuration shown can be extended the addition of further semiconductor components as well as passive elements, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing an integrated circuit device, comprising:
   providing a carrier;
   attaching a plurality of semiconductor devices including an integrated circuit to the carrier, the semiconductor devices including first and second transistors, each of the transistors having source, drain and gate connections;
   applying an insulation layer over the semiconductor device and the carrier by a gas-phase deposition:
   depositing conductive lines on the insulation layer to connect the semiconductor devices to the carrier; and
   depositing conductive lines to interconnect the semiconductor devices, including connecting the drain connection of the first transistor to the source connection of the second transistor.

2. The method of claim 1, wherein applying an insulation layer over the semiconductor device and the carrier by a gas-phase deposition includes a chemical vapor deposition.

3. The method of claim 1, wherein depositing conductive lines on the insulation layer includes a photolithographic process.

4. The method of claim 1, wherein depositing conductive lines on the insulation layer includes etching.

5. The method of claim 1, wherein depositing conductive lines on the insulation layer includes laser ablation.

6. The method of claim 1, further comprising encapsulating the device.

7. The method of claim 1, wherein the semiconductor device includes a source portion and a drain portion, and wherein the method further comprises:
   attaching the semiconductor device to the carrier to provide a gap between the source and drain portions; and
   depositing an insulating material into the gap.

8. The method of claim 7, wherein applying the insulation layer over the semiconductor device and the carrier includes applying the insulation layer by the gas-phase deposition over the source and drain portions and the insulation material situated in the gap.

9. The method of claim 1, wherein the plurality of semiconductor devices include a logic device, the method further comprising:
   depositing conductive lines to connect the logic device to the gate connections of the first and second transistors.

10. The method of claim 1, wherein applying the insulation layer over the semiconductor device and the carrier includes applying a plasmapolymer layer by a gas-phase deposition.

11. The method of claim 10, wherein the plasmapolymer is a Parylene.

12. The method of claim 1, wherein applying the insulation layer over the semiconductor device and the carrier includes applying an amorphous inorganic layer by a gas-phase deposition.

* * * * *